United States Patent
Ikegami et al.

(10) Patent No.: US 9,653,256 B2
(45) Date of Patent: May 16, 2017

(54) CHARGED PARTICLE-BEAM DEVICE

(71) Applicant: Hitachi High-Technologies Corporation, Minato-ku, Tokyo (JP)

(72) Inventors: Akira Ikegami, Tokyo (JP); Hideto Dohi, Tokyo (JP); Hideyuki Kazumi, Tokyo (JP); Yoichi Ose, Tokyo (JP); Naomasa Suzuki, Tokyo (JP); Momoyo Enyama, Tokyo (JP); Ryuji Nishi, Osaka (JP); Akio Takaoka, Osaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 15/035,265

(22) PCT Filed: Nov. 5, 2014

(86) PCT No.: PCT/JP2014/079308
§ 371 (c)(1),
(2) Date: May 9, 2016

(87) PCT Pub. No.: WO2015/068717
PCT Pub. Date: May 14, 2015

(65) Prior Publication Data
US 2016/0300690 A1   Oct. 13, 2016

(30) Foreign Application Priority Data

Nov. 11, 2013 (JP) ................................. 2013-232668

(51) Int. Cl.
*H01J 3/26*   (2006.01)
*H01J 37/28*   (2006.01)
(Continued)

(52) U.S. Cl.
CPC ................ *H01J 37/28* (2013.01); *H01J 3/12* (2013.01); *H01J 37/14* (2013.01); *H01J 37/147* (2013.01);
(Continued)

(58) Field of Classification Search
CPC ........ H01J 37/26; H01J 37/261; H01J 37/266; H01J 37/268; H01J 37/28; H01J 37/04;
(Continued)

(56) References Cited

U.S. PATENT DOCUMENTS

2003/0029999 A1* 2/2003 Hosokawa ............. G01N 23/04
250/310
2005/0214958 A1* 9/2005 Nakasuji ............... G01N 23/225
438/14
(Continued)

FOREIGN PATENT DOCUMENTS

| | | |
|---|---|---|
| JP | 2006-12664 A | 1/2006 |
| JP | 2007-128893 A | 5/2007 |
| JP | 2010-9907 | 1/2010 |

OTHER PUBLICATIONS

International Search Report (PCT/ISA/210) issued in PCT Application No. PCT/JP2014/079308 dated Jan. 27, 2015 with English translation (4 pages).

(Continued)

*Primary Examiner* — Jason McCormack
(74) *Attorney, Agent, or Firm* — Crowell & Moring LLP

(57) ABSTRACT

Provided is a charged-particle-beam device capable of simultaneously cancelling out a plurality of aberrations caused by non-uniform distribution of the opening angle and energy of a charged particle beam. The charged-particle-beam device is provided with an aberration generation lens for generating an aberration due to the charged particle beam passing off-axis, and a corrective lens for causing the (Continued)

trajectory of the charged particle beam to converge on the main surface of an objective lens irrespective of the energy of the charged particle beam. The main surface of the corrective lens is disposed at a crossover position at which a plurality of charged particle beams having differing opening angles converge after passing through the aberration generation lens.

12 Claims, 10 Drawing Sheets

(51) Int. Cl.
  *H01J 37/147* (2006.01)
  *H01J 37/153* (2006.01)
  *H01J 3/12* (2006.01)
  *H01J 37/14* (2006.01)

(52) U.S. Cl.
  CPC ......... *H01J 37/153* (2013.01); *H01J 2237/15* (2013.01); *H01J 2237/2611* (2013.01); *H01J 2237/2814* (2013.01)

(58) Field of Classification Search
  CPC .. H01J 37/10; H01J 37/12; H01J 37/14; H01J 37/141; H01J 37/1413; H01J 37/1416; H01J 37/143; H01J 37/145; H01J 37/147; H01J 37/1472; H01J 37/1474; H01J 37/1475; H01J 37/1477
  USPC .............. 250/306, 307, 311, 396 R, 396 ML
  See application file for complete search history.

(56) References Cited

U.S. PATENT DOCUMENTS

2008/0179536 A1   7/2008  Sato et al.
2008/0290264 A1   11/2008 Henstra et al.
2009/0322973 A1   12/2009 Ito et al.

OTHER PUBLICATIONS

Japanese-language Written Opinion (PCT/ISA/237) issued in PCT Application No. PCT/JP2014/079308 dated Jan. 27, 2015 (4 pages).

* cited by examiner

CHARGED PARTICLE-BEAM DEVICE

TECHNICAL FIELD

The present invention relates to a charged-particle-beam device for irradiating charged-particle beams on a specimen.

BACKGROUND ART

An important function of making a 3D observation of a specimen is required for a device for examining a 3D specimen by use of charged-particle beams such as electron beams. When a specimen is subjected to 3D observation by use of an electronic microscope, the stage is tilted thereby to acquire a 3D image of the specimen. However, a mechanical operation is required for tilting the stage or column, which deteriorates throughput or reproducibility of tilt angle. As a method for making a 3D measurement of a specimen without tilting the stage, there is assumed that beams are tilted by use of a deflector. However, when beams are tilted (deflected) by a deflector, an aberration is generated and the beam diameter increases.

PTL 1 describes a technique capable of lowering energy when charged-particle beams pass through a corrector than energy when they pass through a lens whose chromatic aberration is to be corrected, thereby lowering a required specification for lens power supply stability, PTL 1 describes that beams with different energy are converged near the principal plane of a lens thereby to create an achromatic space on the image plane of the lens.

CITATION LIST

Patent Literature

PTL 1: Japanese Patent Publication (Kokai) No. 2007-128893

SUMMARY OF INVENTION

Technical Problem

A scanning electronic microscope for making a 3D observation of a specimen by tilting electron beams requires that electrons discharged from a chip are focused on a specimen by use of a plurality of optical elements, electron beams are tilted by a deflector, and the tilted beams are scanned on the specimen. In this case, electron beams are tilted, and thus primary electron beams pass off the axis of the lens, and consequently an aberration is generated and a resolution is deteriorated. The electron beams discharged from the chip are not constant in energy and exit angle (opening angle) but are distributed. Therefore, when the electron beams are tilted, an aberration due to a difference in energy and a plurality of aberrations (such as deflected chromatic aberration, deflected coma aberration and high-order chromatic aberration) due to a difference in opening angle are generated, which increases the beam diameter. With the use of the technique described in PTL 1, a high-order chromatic aberration can be prevented from occurring and an achromatic space can be created on the image plane of the lens, but the technique described in PTL 1 has the two following problems.

(Problem 1) A high-order chromatic aberration can be restricted to some extent, but a mechanism for reversely generating a high-order chromatic aberration is not provided, and thus a generated high-order chromatic aberration cannot be corrected.

(Problem 2) A method for correcting an aberration due to an opening angle as well as preventing a high-order chromatic aberration from occurring is not described.

With the technique described in PTL 1, it is assumed that all the above aberrations are difficult to cancel at the same time due to the above problems. In particular, under the condition that a plurality of aberrations stand out as the electron beams are tilted at a larger angle (such as 10 degrees or more), an increase in beam diameter and a deterioration in resolution are remarkable.

The present invention has been made in terms of the above problems, and an object thereof is to provide a charged-particle-beam device capable of cancelling a plurality of aberrations at the same time generated by energy and opening angles of charged-particle beams which are not constant but are distributed.

Solution to Problem

A charged-particle-beam device according to the present invention includes an aberration generation lens for generating an aberration when charged-particle beams pass off the axis, and a correction lens for focusing trajectories of the charged-particle beams on the principal plane of an objective lens irrespective of energy of the charged-particle beams, wherein the principal plane of the correction lens is arranged at a crossover position where the charged-particle beams with different opening angles pass through the aberration generation lens and then focus.

Advantageous Effects of Invention

With the charged-particle-beam device according to the present invention, it is possible to restrict a resolution from deteriorating even when charged-particle beams are largely deflected.

DESCRIPTION OF EMBODIMENTS

First Exemplary Embodiment

Figure 1:
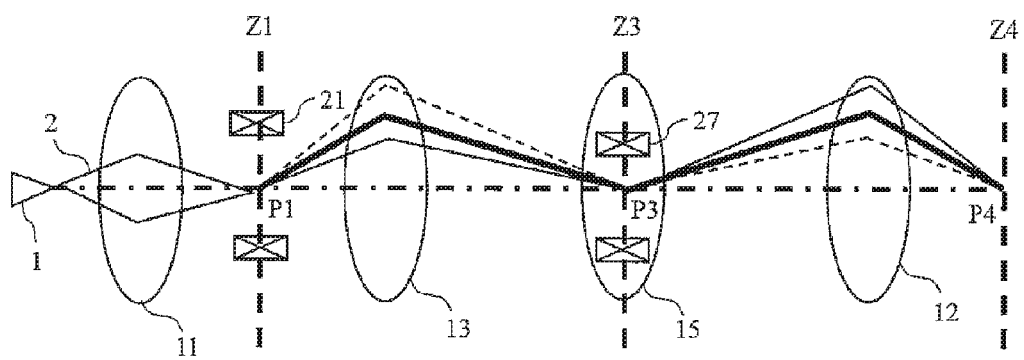
FIG. 1 is a diagram for explaining a structure of an optical system provided in a charged-particle-beam device according to a first exemplary embodiment.

FIG. 1 is a diagram for explaining a structure of an optical system provided in a charged-particle-beam device according to a first exemplary embodiment of the present invention. A scanning electronic microscope (SEM) will be described below as an exemplary charged-particle-beam device. The optical system according to the first exemplary embodiment includes an objective lens 12, a correction lens 15, an aberration generation lens 13, and a condenser lens 11. The objective lens 12 focuses charged-particle beams (electron beams) 2 on a point P4 on an image plane Z4. The aberration generation lens 13 is configured to have an equivalent property to the objective lens 12, and generates an aberration when electron beams 2 passing through the condenser lens 11 pass off the axis. The correction lens 15 focuses the electron beams 2 with different energy on the principal plane of the objective lens 12. The principal plane of the correction lens 15 is arranged to overlap on the object plane of the objective lens 12.

The electron beams 2 discharged from an electron source 1 are focused on a point P1 on a plane Z1 by the condenser lens 11. The electron beams 2 focused on the point P1 are deflected by a deflector 21 installed on Z1, and pass off the axis of the aberration generation lens 13. The aberrations caused by the aberration generation lens 13 are different depending on an opening angle of the electron beams 2. The electron beams 2 passing through the aberration generation lens 13 focus on a point P3 on the principal plane Z3 of the correction lens 15 (the object plane of the objective lens 12) irrespective of the opening angles of the electron beams 2, and cross over on the point P3. Some of the electron beams 2 with different opening angles, which pass through a center trajectory, are indicated in a bold line, and others that pass through the other two trajectories are indicated in a line and a dotted line.

A deflector 27 is arranged on the principal plane Z3 of the correction lens 15 (the object plane of the objective lens 12). The deflector 27 deflects the electron beams 2 and pass them off the axis of the objective lens 12. The trajectories of the electron beams 2 deflected by the deflector 27 are different depending on the opening angles non-deflected by the deflector 27, but the electron beams 2 pass through the objective lens 12 and then focus on the point P4 in any trajectory, and are tilted to be incident on a specimen arranged on the point.

Figure 2:
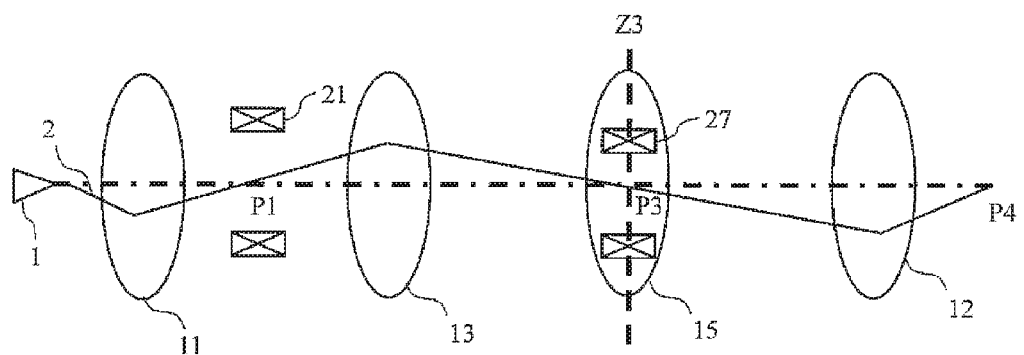
FIG. 2 is a diagram illustrating a difference of a trajectory of electron beams 2 indicated in a dotted line of FIG. 1 relative to a center trajectory of electron beams 2 indicated in a bold line of FIG. 1.
Figure 3:
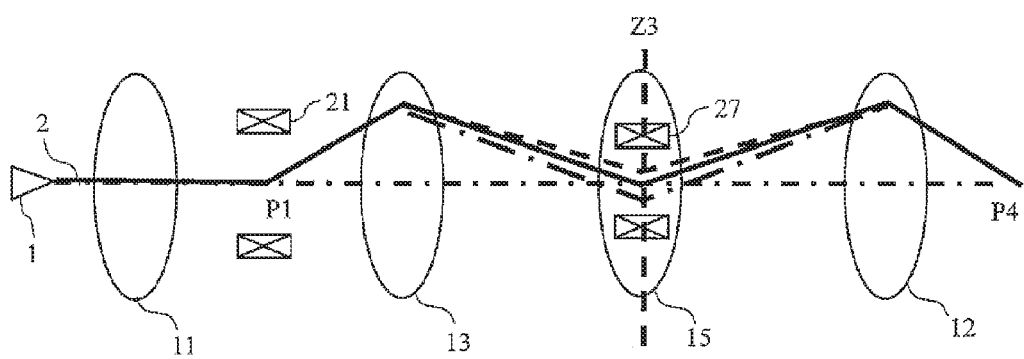
FIG. 3 is a diagram illustrating a plurality of trajectories of electron beams 2 with different energy.

FIG. 2 is a diagram illustrating a difference of the trajectory of the electron beams 2 indicated in a dotted line of FIG. 1 relative to the center trajectory of the electron beams 2 indicated in a bold line of FIG 1. In FIG. 2, an offset relative to the center trajectory on the principal plane of the aberration generation lens 13 and an offset relative to the center trajectory on the principal plane of the objective lens 12 are arranged to be antisymmetric about the principal plane Z3 of the correction lens 15. With the arrangement, aberrations generated due to a difference in opening angle of the electron beams 2 can be cancelled. That is, a deflected coma aberration and a deflected chromatic aberration generated between the plane Z1 and the principal plane Z3, and those generated between the principal plane Z3 and the image plane Z4 are equal in amount and different in sign to cancel each other FIG. 3 is a diagram illustrating a plurality of trajectories of the electron beams 2 with different energy. The electron beams 2 discharged from the chip 1 are deflected by the deflector 21 to be incident into the aberration generation lens 13. The electron beams 2 with low energy (in a chain line) are strongly affected by the operation of the aberration generation lens 13, and the electron beams 2 with high energy (in a dotted line) are weakly affected by the operation of the aberration generation lens 13. Consequently, an offset between the trajectories (color variance) due to a difference in energy is caused. The electron beams 2 with different energy, which are incident into the correction lens 15, are reversely swung back by the deflector 27 arranged on the principal plane of the correction lens 15 to focus on the principal plane of the objective lens 12.

In FIG. 3, an offset between the trajectories of the electron beams 2 due to a difference in energy are reversely swung back with reference to the principal plane Z3 of the correction lens 15. Consequently, an aberration due to a difference in energy of the electron beams 2 (high-order chromatic aberration proportional to the product of the cube of tilt angle $\theta i$ and the difference $\Delta \Phi$ in energy) can be cancelled. That is, the aberration generated between the aberration generation lens 13 and the principal plane Z3 and the aberration generated between the principal plane Z3 and the objective lens 12 are equal in amount and different in sign to cancel each other.

Therefore, in the optical system according to the first exemplary embodiment, while the opening angles of the electron beams 2 are different between the aberration generation lens 13 and the objective lens 12 (FIG. 1), the electron beams 2 with different energy are focused by use of the lenses (FIG. 3). On the other hand, while the electron beams 2 are different in energy in the correction lens 15 (FIG. 3), the electron beams 2 with different opening angles are focused by use of the lens (FIG. 1). An aberration due to a difference in energy and an aberration due to a difference in opening angle (such as deflected chromatic aberration, deflected coma aberration, or high-order chromatic aberration), which are generated when the electron beams 2 are tilted, can be corrected at the same time.

Figure 4:
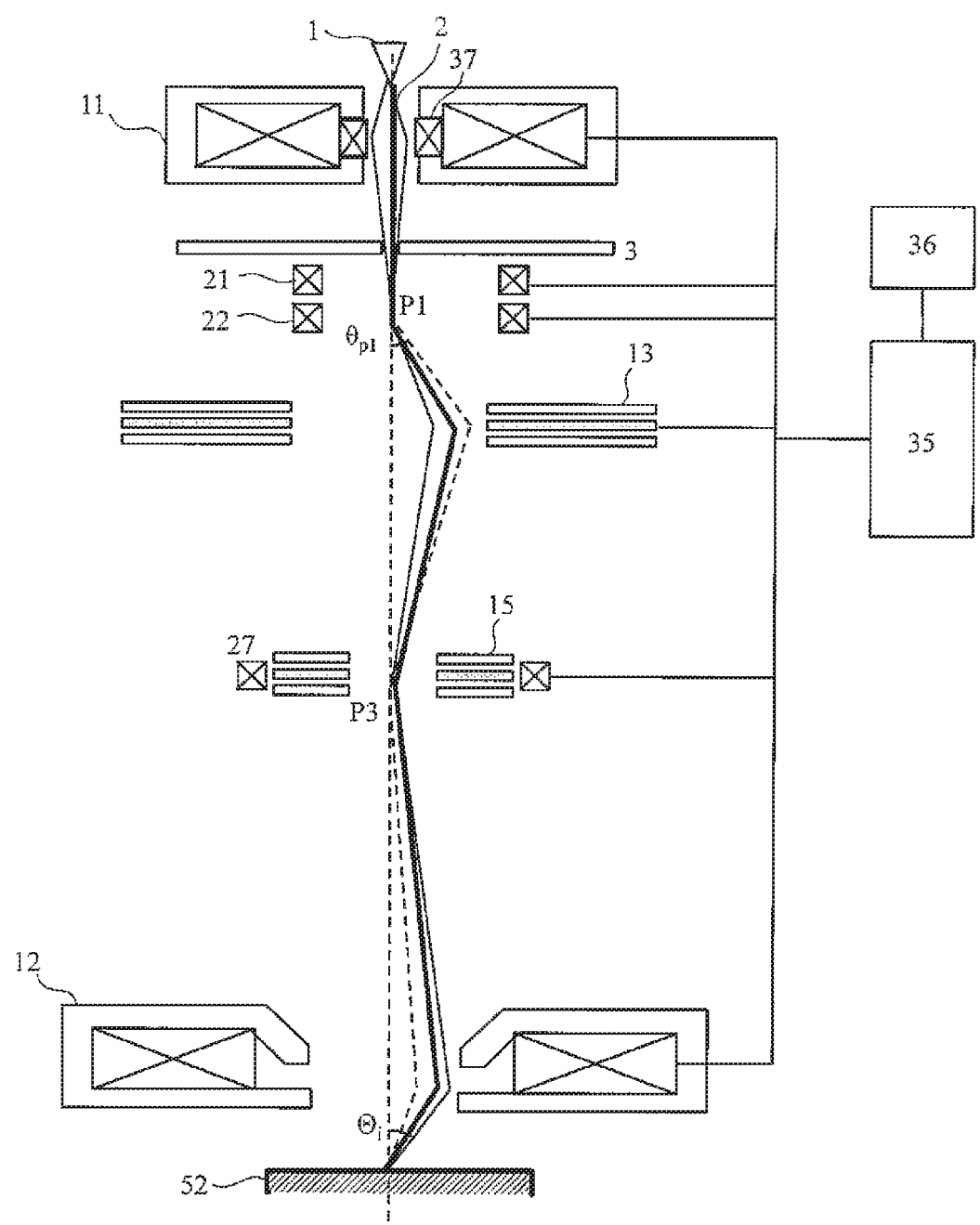
FIG. 4 is a side view illustrating a structure of the charged-particle-beam device according to the first exemplary embodiment.

FIG. 4 is a side view illustrating a structure of the charged-particle-beam device according to the first exemplary embodiment. The exemplary trajectories of the electron beams 2, which correspond to those in FIG. 1, are illustrated. An optical element control unit 35 controls the operations of the lenses and the deflectors. An optical condition storage unit 36 stores the operation parameters such as setting parameters of the lenses and deflection intensities of the deflectors.

The electron beams 2 discharged from the chip 1 pass through the condenser lens 11 and are limited in opening angle by an objective diaphragm 3 to be focused on the point P1. The electron beams 2 are deflected by the deflector 21 (a deflector 22 may be further provided) and pass off the axis of the aberration generation lens 13 to be focused on the point P3 where the correction lens 15 and the deflector 27 are installed. The electron beams 2 are swung back by the deflector 27 to be incident into the objective lens 12, and are tilted to reach a specimen 52. It is possible to adjust a focus of the electron beams 2 by a lens intensity of the objective lens 12 and to make an astigmatic adjustment by the excitation amount of a stigma coil 37 installed in the condenser lens 11.

First Exemplary Embodiment: Conclusion

Figure 5:
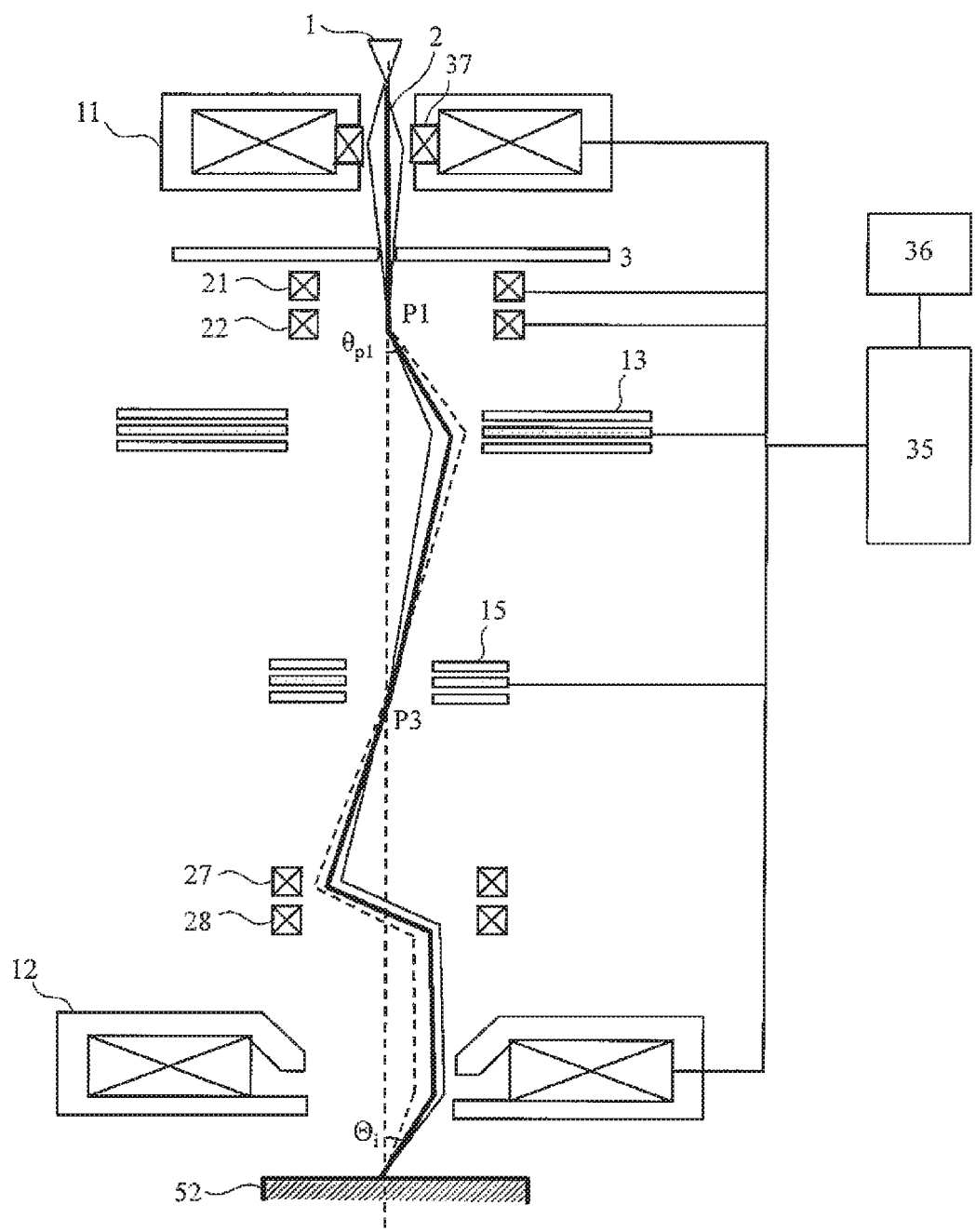
FIG. 5 is a side view illustrating a structure of a charged-particle-beam device according to a second exemplary embodiment.

As described above, in the charged-particle-beam device according to the first exemplary embodiment, the principal plane Z3 of the correction lens 15 is arranged at a crossover position where the electron beams 2 with different opening angles pass through the aberration generation lens 13 and then focus. Further, the principal plane of the correction lens 15 is arranged to overlap on the object plane of the objective lens 12. With the arrangement, it is possible to correct an aberration due to a difference in energy of the electron beams 2 and an aberration due to a difference in opening angle of the electron beams 2 at the same time, Second Exemplary Embodiment FIG. 5 is a side view illustrating a structure of a charged-particle-beam device according to a second exemplary embodiment of the present invention. According to the second exemplary embodiment, the electron beams 2 are swung back by use of two-stage deflectors 27 and 28 installed between the correction lens 15 and the objective lens 12 instead of the deflector 27 arranged on the principal plane Z3 of the correction lens 15. In order to strictly make the aberration correction, it is desirable that the deflector 27 is installed on the principal plane Z3 of the correction lens 15 to swing back the electron beams 2 as in the first exemplary embodiment, but the deflector 27 may be difficult to arrange at the position in terms of design. In such a case, the electron beams 2 can be swung back by the two-stage deflectors 27 and 28 illustrated in FIG. 5. Also in this case, a deterioration in resolution is not practically problematic and the same effects as in the first exemplary embodiment can be expected.

Third Exemplary Embodiment

Figure 6:
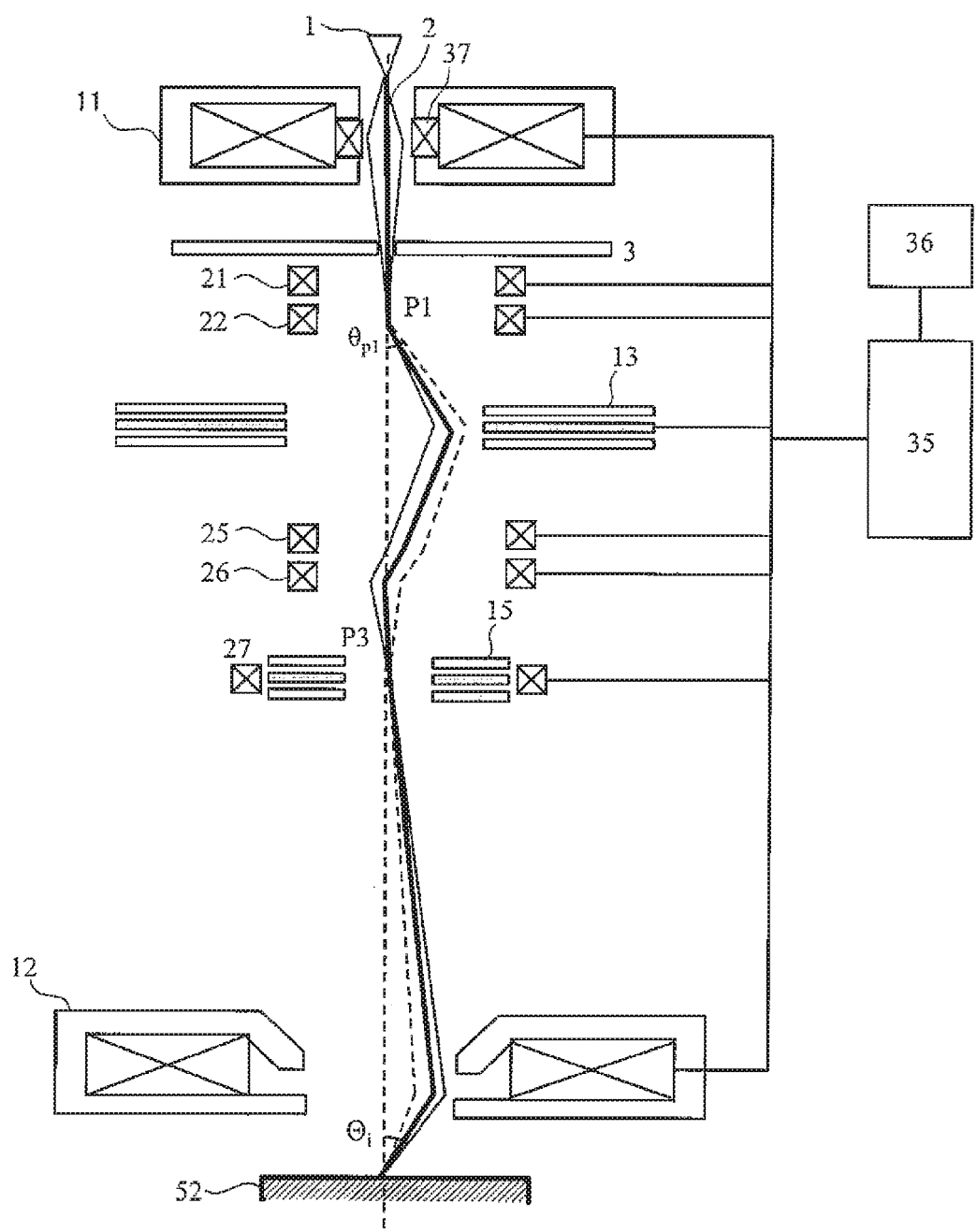
FIG. 6 is a side view illustrating a structure of a charged-particle-beam device according to a third exemplary embodiment.

FIG. 6 is a side view illustrating a structure of a charged-particle-beam device according to a third exemplary embodiment of the present invention. According to the third exemplary embodiment, two-stage deflectors 25 and 26 are installed between the aberration generation lens 13 and the correction lens 15 in order to correct an aberration changing depending on an irradiation angle when the irradiation angle of the electron beams 2 is variously changed.

When the electron beams 2 pass off the axis of the aberration generation lens 13, a positional offset proportional to the cube of the correction amount ($\infty \theta_{P1}$) is generated on the image plane of the aberration generation lens 13 (the principal plane Z3 of the correction lens 15), The two-stage deflectors 25 and 26 correct the positional offset, and correct the trajectory of the electron beams 2 such that the center trajectory (in a bold line) of the electron beams 2 passes through the center of the correction lens 15. With the corrected trajectory, when an irradiation angle of the electron beams 2 is variously changed, the electron beams 2 can pass through the center of the correction lens 15 without passing off the axis of the correction lens 15. Thereby, even when an irradiation angle of the electron beam 2 is variously changed, the trajectory of the electron beams 2 can be controlled such that another aberration is not generated by the correction lens 15.

Fourth Exemplary Embodiment

According to the first to third exemplary embodiments, the aberration generation lens 13 needs to be designed as an equivalent lens to the objective lens 12. Instead, according to a fourth exemplary embodiment of the present invention, a mechanism for adjusting a lens condition is provided such that aberrations equal in amount and different in sign can be generated for an aberration component of interest in terms of aberrations to be corrected (deflected chromatic aberration and deflected coma aberration in this example), thereby correcting an aberration caused on the objective lens 12.

Figure 7:
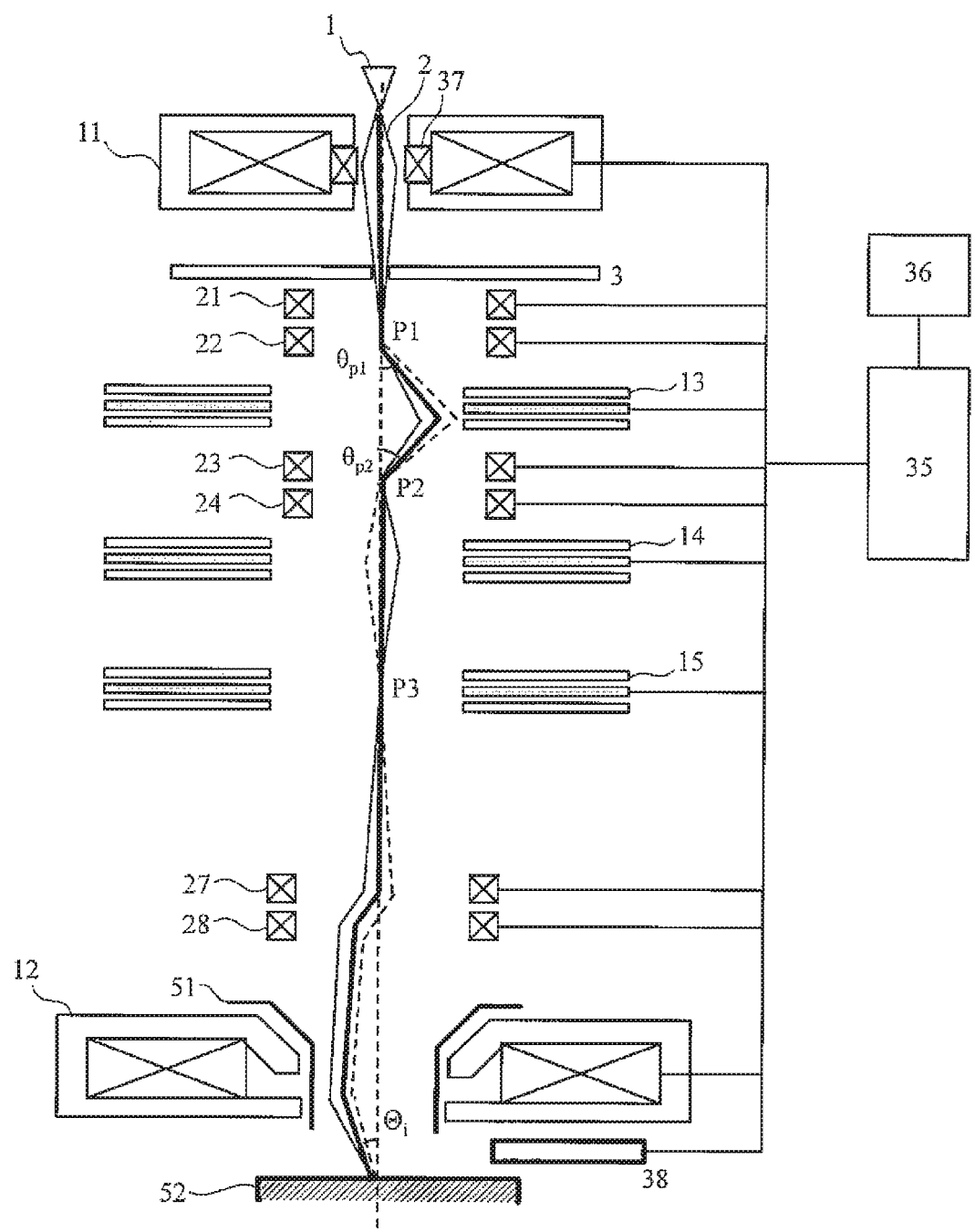
FIG. 7 is a side view illustrating a structure of a charged-particle-beam device according to a fourth exemplary embodiment.

FIG. 7 is a side view illustrating a structure of a charged-particle-beam device according to the fourth exemplary embodiment. According to the fourth exemplary embodiment, an aberration adjustment lens 14 is arranged behind the aberration generation lens 13, and a correction aberration is generated by use of a combination lens configured of the two lenses.

A boosting electrode 51 for accelerating the electron beams 2 is installed near the objective lens 12. The specimen 52 is provided with a mechanism capable of applying a deceleration voltage. In this way, under an environment where an electric field or magnetic field is applied in a superimposed manner, the optical property of the objective lens 12 changes due to an applied voltage to the boosting electrode 51 or a deceleration voltage applied to the specimen 52. Thus, it is assumed to dynamically cancel an aberration of the changed objective lens 12 due to a combination effect of the aberration adjustment lens 14 behind the aberration generation lens 13. A stage height measurement device 38 measures a height of the stage where the specimen 52 is placed.

The electron beams 2 are focused on the point P1 and deflected by the deflector 21 (or the deflectors 21 and 22) thereby to pass off the axis of the aberration generation lens 13 similarly as in the first exemplary embodiment. The aberration generation lens 13 generates deflected aberrations (deflected chromatic aberration and deflected coma aberration) increasing depending on the deflection amount $\theta_{P1}$ by the deflector 21. Deflectors 23 and 24 correct the trajectory of the electron beams 2 such that they pass through the center of the aberration adjustment lens 14. The deflected chromatic aberration and the deflected coma aberration generated on the aberration generation lens 13 are reflected on the point P3 according to a lens magnification of the aberration adjustment lens 14. A deflected coma aberration and a deflected chromatic aberration generated on the objective lens 12 can be corrected by use of the aberrations reflected on the point P3.

A method for adjusting the generated aberration amount by use of the aberration adjustment lens 14 will be specifically described below. For brief description, there will be assumed that a virtual deflection point when the electron beams 2 are deflected by use of the deflectors 21 and 22 is matched with P1. A deflected chromatic aberration and a deflected coma aberration generated on the image plane of the aberration generation lens 13 are expressed in the following Equations.

[Math. 1]

$$(\Delta U_{Coma})_{Cor\_P2} = (Cs_{13})_{P2}\alpha_{P2}^2\theta_{P2}^* + 2(Cs_{13})_{P2}\alpha_{P2}\alpha_{P2}^*\theta_{P2} \quad (1)$$

$$(\Delta U_C)_{Cor\_P2} = (Cc_{13})_{P2}\theta_{P2}^*\frac{\Delta\Phi}{\Phi_{P2}} \quad (2)$$

$(\Delta U_{Coma})_{Cor\_P2}$: The coma aberration amount on P2 generated by a deflected aberration corrector $(\Delta U_C)_{Cor\_P2}$: The chromatic aberration amount on P2 generated by the deflected aberration corrector $(Cs_{13})_{P2}$: Spherical aberration coefficient of the lens 13 (image plane definition)

$(Cc_{13})_{P2}$: Chromatic aberration coefficient of the lens 13 (image plane definition)

$\alpha_{P2}$: Beam opening angle on the image plane of the lens 13

$\alpha_{P2}^*$: Complex conjugate of $\alpha_{P2}$ $\theta_{P2}$: Tilt angle on P2

$\theta_{P2}^*$: Complex conjugate of $\theta_{P2}$ $\Delta\Phi$: Energy width of the electron beams 2 discharged from the chip 1.

$\Phi_{P2}$: Potential of electron beams on P2

The respective aberration amounts reflected on the point P3 by the aberration enlargement lens 14 are expressed in the following Equations.

[Math. 2]

$$(\Delta U_{Coma})_{Cor\_P3} = \frac{MA_{14}^2}{M_{14}}((Cs_{13})_{P2}\alpha_{P3}^2\theta_{P2}^* + 2(Cs_{13})_{P2}\alpha_{P3}\alpha_{P3}^*\theta_{P2}) \quad (1)'$$

$$(\Delta U_C)_{Cor\_P3} = \frac{1}{M_{14}}\frac{\Phi_{P3}}{\Phi_{P2}}(Cc_{13})_{P2}\theta_{P2}^*\frac{\Delta\Phi}{\Phi_{P2}} = \frac{1}{M_{14}^3 MA_{14}^2}\left((Cc_{13})_{P2}\theta_{P2}^*\frac{\Delta\Phi}{\Phi_{P3}}\right) \quad (2)'$$

$(\Delta U_{Coma})_{Cor\_P3}$: The coma aberration amount on P3 generated by the deflectors 23 and 24

$(\Delta U_C)_{Cor\_P3}$: The chromatic aberration amount on P3 generated by the deflectors 23 and 24

$MA_{14}$: Angle magnification of the aberration adjustment lens 14

$M_{14}$: Magnification of the aberration adjustment lens 14

$\alpha_{P3}$: Opening angle of the electron beams 2 on P3

$\alpha_{P3}^*$: Complex conjugate of $\alpha_{P3}$ $\Phi_{P3}$: Potential of the electron beams 2 on P2

A deflected chromatic aberration and a deflected coma aberration generated by the objective lens 12, which are defined on the object plane Z3 of the objective lens 12, are expressed in the following Equations.

[Math. 3]

$$(\Delta U_{Coma})_{obj\_P3} = MA_{obj}((Cs_{obj})_{P3}\alpha_{P3}^2\theta_i^* + 2(Cs_{obj})_{P3}\alpha_{P3}\alpha_{P3}^*\theta_i) \quad (3)$$

$$(\Delta U_C)_{obj\_P3} = MA_{obj}(Cc_{obj})_{P3}\theta_i\frac{\Delta\Phi}{\Phi_{P3}} \quad (4)$$

$(\Delta U_{Coma})_{obj\_P3}$: The coma aberration amount generated on the objective lens 12 when the electron beams 2 are tilted (converted into magnitude on P3)

$(\Delta U_C)_{Cor\_P3}$: The chromatic aberration amount generated on the objective lens when the electron beams 2 are tilted (converted into magnitude on P3)

$MA_{obj}$: Angle magnification of the objective lens 12

$M_{obj}$: Magnification of the objective lens 12

$(Cs_{obj})_{P3}$: Spherical aberration coefficient of the objective lens 12 (object plane definition)

$(Cc_{obj})_{P3}$: Chromatic aberration coefficient of the objective lens 12 (object plane definition)

$\theta_{P3}$: Tilt angle on P3

$\theta_{P3}^*$: Complex conjugate of $\theta_{P3}$ $\theta_i$: Tilt angle of beams (specimen plane)

The sums of the aberration (Equation (1)', Equation (2)') reflected on the point P3 by the aberration enlargement lens 14 and the aberration (Equation (3), Equation (4)) of the objective lens 12 are expressed in the following Equations, respectively.

[Math. 4]

$$(\Delta U_{Coma})_{all\_P4} = \quad (5)$$

$$MA_{obj}\left(\begin{array}{l}MA_{obj}((Cs_{obj})_{P3}\alpha_{P3}^2\theta_i^* + 2(Cs_{obj})_{P3}\alpha_{P3}\alpha_{P3}^*\theta_i) + \\ \frac{MA_{14}^2}{M_{14}}((Cs_{13})_{P2}\alpha_{P3}^2\theta_{P2}^* + 2(Cs_{13})_{P2}\alpha_{P3}\alpha_{P3}^*\theta_{P2})\end{array}\right)$$

$$(\Delta U_C)_{all\_P4} = \quad (6)$$

$$M_{obj}\left(MA_{obj}(Cc_{obj})_{P3}\theta_i\frac{\Delta\Phi}{\Phi_{P3}} + \frac{1}{M_{14}^3 MA_{14}^2}\left((Cc_{13})_{P2}\theta_{P2}^*\frac{\Delta\Phi}{\Phi_{P3}}\right)\right)$$

$(\Delta U_{Coma})_{all\_P4}$: The deflected coma aberration amount generated in the entire optical system (specimen plane definition)

$(\Delta U_C)_{Cor\_P3}$: The deflected chromatic aberration amount generated in the entire optical system (specimen plane definition)

A condition (correction condition) for making Equation (5) an Equation (6) zero at the same time is expressed in the following Equations. Equation (7) is a condition for correcting a deflected chromatic aberration and a deflected coma aberration at the same time, and Equation (8) is a deflection angle given on the points P1 and P3 during correction.

[Math. 5]

$$\frac{M_{14}^2}{MA_{14}^4}\left(\frac{(Cs_{13})_{P2}}{(Cc_{13})_{P2}}\right) = \left(\frac{(Cs_{obj})_{P3}}{(Cc_{obj})_{P3}}\right) \quad (7)$$

[Math. 6]

$$\theta_{P1} = \left(\frac{M_{14}}{MA_{14}^2}\right)\frac{MA_{obj}}{MA_{13}}\frac{(Cs_{obj})_{P3}}{(Cs_{13})_{P2}}\theta_i \quad (8)$$

$$\theta_{P3} = MA_{obj}\theta_i \quad (9)$$

A condition for correcting a deflected chromatic aberration and a deflected coma aberration at the same time will be considered according to Equation (7). The right side of Equation (7) is determined by the spherical aberration coefficient Cs and the chromatic aberration coefficient Cc of the object plane definition of the objective lens 12, and indicates a rate at which the deflected coma aberration and the deflected chromatic aberration are generated. Therefore, the right side of Equation (7) indicates a rate at which the deflected chromatic aberration and the deflected coma aberration are generated on the objective lens 12, and the left side indicates a rate at which the aberrations are created by the aberration generation lens 13 and the aberration adjustment lens 14. Therefore, under the condition that the right side and the left side match with each other, the deflected chromatic aberration and the deflected coma aberration can be corrected at the same time.

There will be assumed that the potentials $\Phi_{P1}$, $\Phi_{P2}$, and $\Phi_{P3}$ on the points P1, P2, and P3 are the same for brief description. In this case, a condition for correcting the deflected chromatic aberration and the deflected coma aberration at the same time is expressed in the following Equation.

[Math. 7]

$$\frac{1}{MA_{14}^2}\left(\frac{(Cs_{13})_{P2}}{(Cc_{13})_{P2}}\right) = \left(\frac{(Cs_{obj})_{P3}}{(Cc_{obj})_{P3}}\right) \quad (7)'$$

There will be assumed that the intensities of the aberration generation lens 13 and the aberration adjustment lens 14 are adjusted such that the crossover points P1 and P3 are fixed and only the crossover point P2 is vertically moved. When the position of the crossover point P2 is lifted up, the magnification $M_{13}$ of the aberration generation lens 13 decreases. It is known that the following approximations are established between the magnification, and the spherical aberration coefficient Cs and the chromatic aberration coefficient Cc.

[Math. 8]

$$Cs \propto f^3(1+M)^4 \quad (9)$$

$$Cc \propto f(1+M)^2 \quad (10)$$

It is seen from Equations (9) and (10) that when the magnification $M_{13}$ is lowered, the value of Cs/Cc of the aberration generation lens 13 is lowered. When the position of P3 is fixed and the position of P2 is lifted up, the angle magnification $MA_{14}$ of the aberration adjustment lens 14 is increased. Consequently, the component $(1/MA_{14}^2)$ in the left side of Equation (7)' also decreases, thereby lowering a rate (the left side of Equation (7)') of the deflected chromatic aberration and the deflected coma aberration created by a combination of the aberration generation lens 13 and the aberration adjustment lens 14. When the points P1 and P3 are fixed and the position of P2 is lowered, the rate (the left side of Equation (7)') can be increased. The position of the point P3 can be controlled by the optical element control unit 35.

Figure 8:
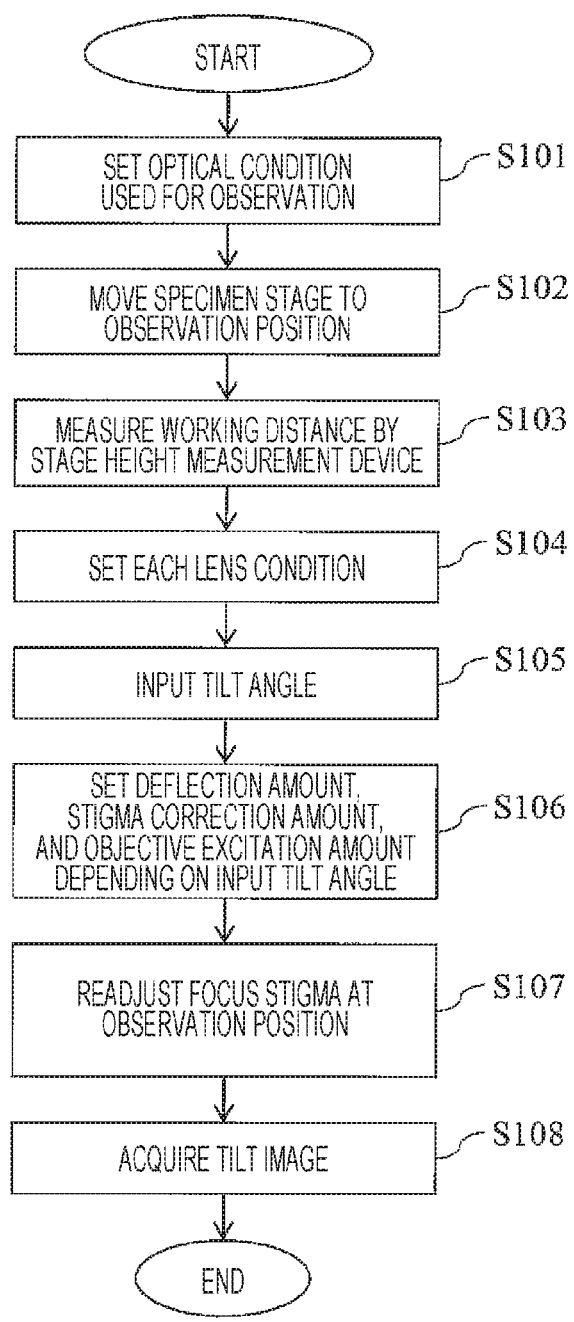
FIG. 8 is a flowchart for explaining the operations of the charged-particle-beam device according to the fourth exemplary embodiment.

FIG. 8 is a flowchart for explaining the operations of the charged-particle-beam device according to the fourth exemplary embodiment. Each step in FIG. 8 will be described.
(FIG. 8: Steps S101 to S102)

An operator determines the optical condition (such as acceleration voltage, booster potential, retarding potential, and object plane position) for observing a specimen, and inputs it into the optical condition storage unit 36 (S101). $(Cs_{obj})_{P3}$ and $(Cc_{obj})_{P3}$ are determined under the optical condition input in step S101. The operator moves the specimen stage to the observation position (S102).
(FIG. 8: Step S103)

The stage height measurement device 38 measures a height of the specimen 52, and stores a working distance based on the measurement result in the optical condition storage unit 36. A height of the specimen 52 may be estimated based on the excitation amount of the objective lens 12 when not tilted instead of the stage height measurement device 38.

(FIG. 8: Step S104)

The optical element control unit 35 calculates a setting parameter of each lens according to Equation (7) or Equation (7)' based on the optical condition stored in the optical condition storage unit 36 in step S101 and the optical condition measured in step S103, and reflects the result on each lens.
(FIG. 8: Steps S105 to S106)

The operator inputs a tilt angle of the electron beams 2 into the optical condition storage unit 36 (S105). The optical element control unit 35 determines a deflection intensity of each deflector and a setting intensity of the stigma coil 37 based on the input tilt angle, and the deflection intensity of each deflector when the beams are tilted which is stored in the optical condition storage unit 36, and reflects them. Step S106 is directed for adjusting each deflector according to the principle described in FIG. 1 to FIG. 3.
(FIG. 8: Steps S107 to S108)

The optical element control unit 35 makes focus adjustment and stigma adjustment (S107). An observation image generator (not illustrated) acquires a tilt image of the specimen 52 by use of secondary electrons discharged from the specimen 52 (S108). When the tilt angle is to he changed, the processing returns to S105, and when the observation condition is to be changed, the processing returns to S104.

Fourth Exemplary Embodiment: Conclusion

As described above, the charged-particle-beam device according to the fourth exemplary embodiment fixes the points P1 and P3 and controls the point P2, thereby adjusting a rate of the deflected coma aberration and deflected chromatic aberration which are to be generated to a rate thereof generated on the objective lens 12. Thereby, even when a rate of the deflected chromatic aberration and the deflected coma aberration generated on the objective lens 12 is varied due to a change in working distance, the point P2 is moved according to the variation amount, thereby correcting the deflected chromatic aberration and the deflected coma aberration at the same time. That is, even when the optical condition of the objective lens 12 is changed, the aberrations on the objective lens 12 can be cancelled due to a combination effect of the aberration generation lens 13 and the aberration adjustment lens 14.

Fifth Exemplary Embodiment

Figure 9:
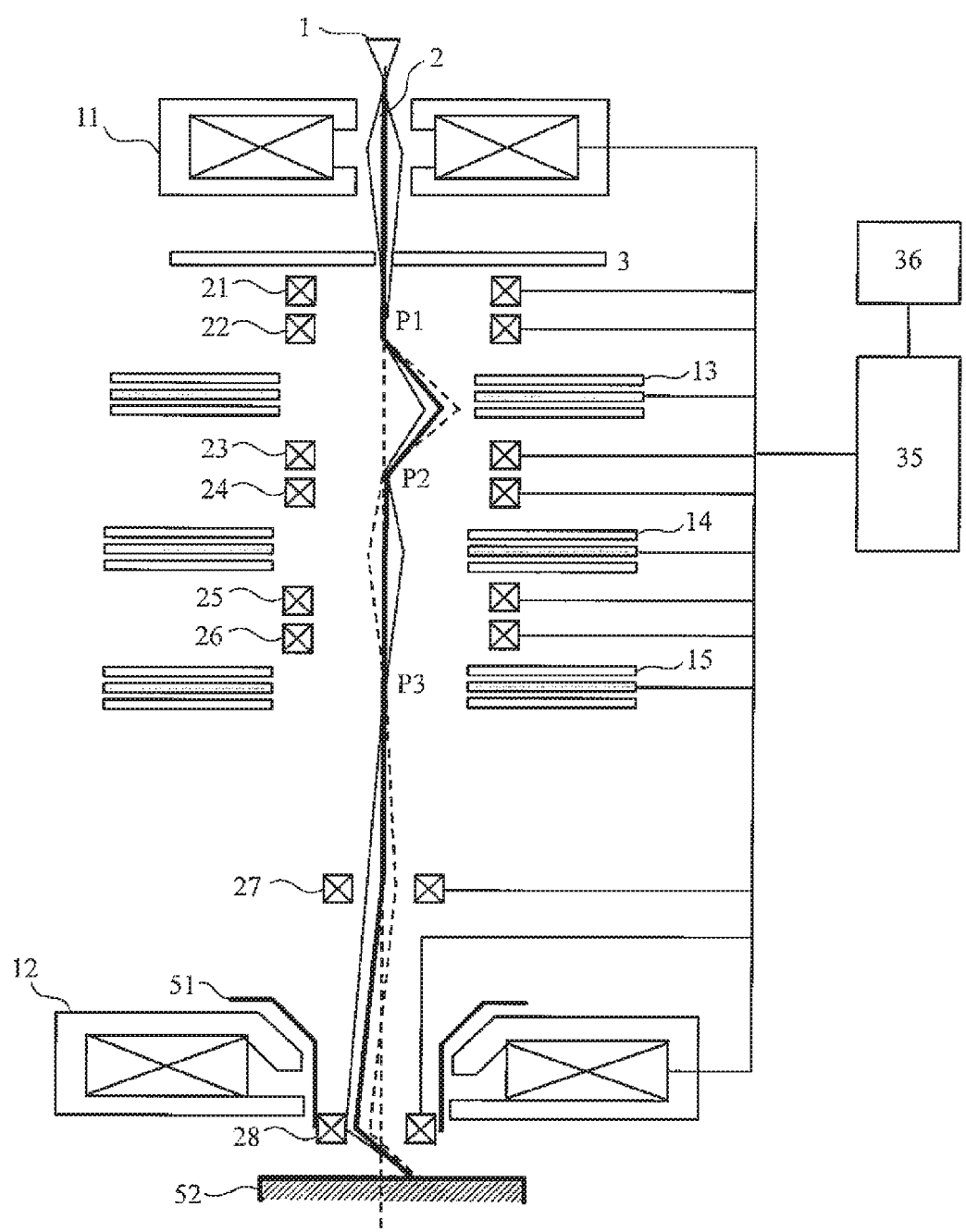
FIG. 9 is a side view illustrating a structure of a charged-particle-beam device according to a fifth exemplary embodiment.

FIG. 9 is a side view illustrating a structure of a charged-particle-beam device according to a fifth exemplary embodiment of the present invention. According to the fifth exemplary embodiment, the electron beams 2 are tilted by use of the deflector 28 installed in the magnetic field of the objective lens 12. An aberration generated on the objective lens 12 is different depending on the operations of the objective lens 12 and the deflector 28. Thus, according to the fifth exemplary embodiment, as in the fourth exemplary embodiment, an aberration generated on the objective lens 12 is dynamically adjusted by a combination effect of the aberration generation lens 13 and the aberration adjustment lens 14. FIG. 9 illustrates an exemplary structure in which the electron beams 2 are faced toward the center of the lens by use of the two-stage deflectors 25 and 26 described according to the third exemplary embodiment, but the structure is not limited thereto.

With the charged-particle-beam device according to the fifth exemplary embodiment, also when an aberration generated on the objective lens 12 is largely varied because the beams are tilted due to a change in the condition of the electromagnetic lens or the trajectory in the lens caused by a deflection in the magnetic field, such as when the objective lens 12 employs an electric/magnetic field lens or when the deflector 28 is arranged as a beam tilt means in the magnetic field of the objective lens 12, the aberration can be dynamically corrected.

Sixth Exemplary Embodiment

Figure 10:
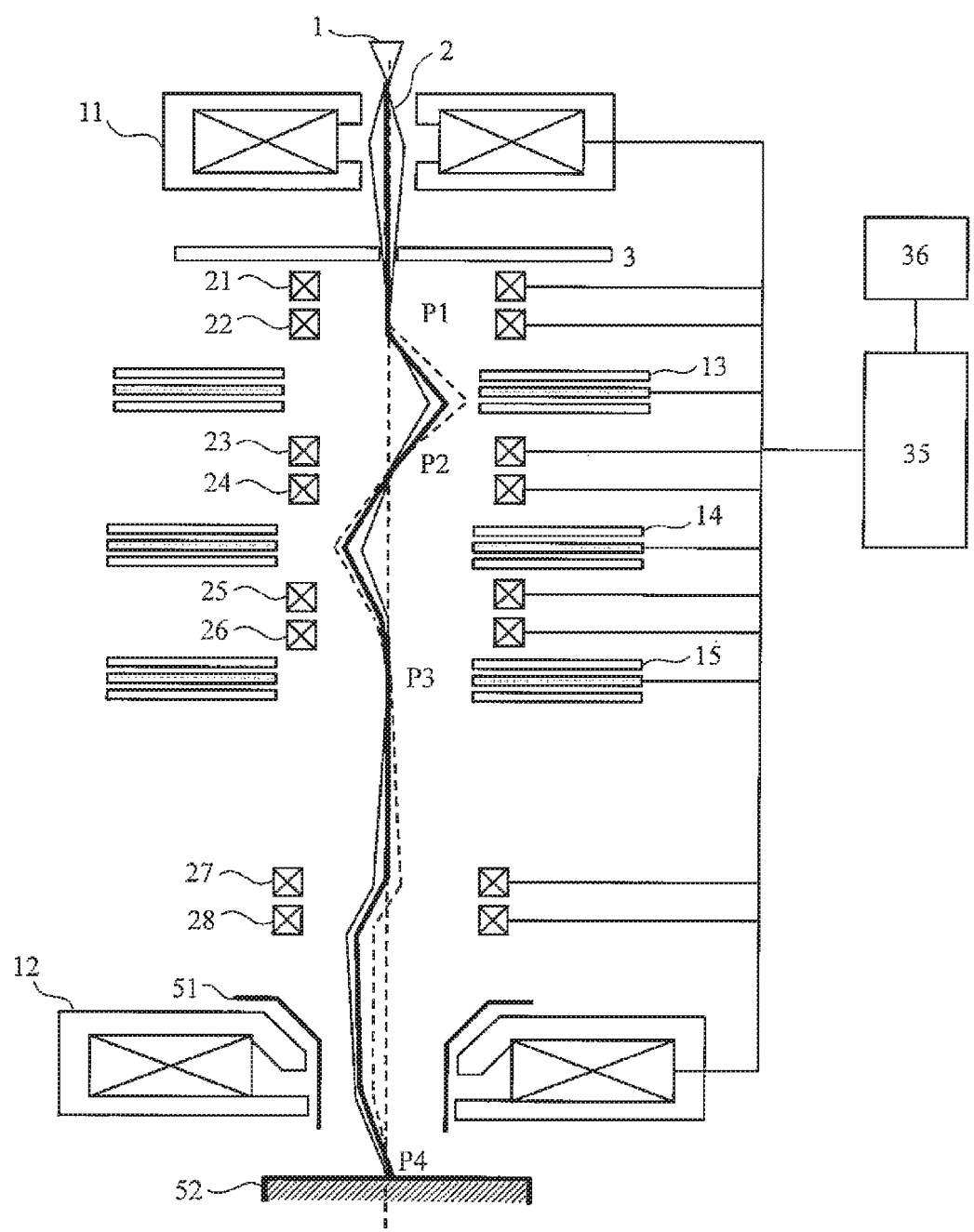
FIG. 10 is a side view illustrating a structure of a charged-particle-beam device according to a sixth exemplary embodiment.

FIG. 10 is a side view illustrating a structure of a charged-particle-beam device according to a sixth exemplary embodiment of the present invention. According to the sixth exemplary embodiment, the two-stage deflectors 23 and 24 deflect a trajectory of the electron beams 2 such that the electron beams 2 pass off the axis of the aberration adjustment lens 14. According to the sixth exemplary embodiment, a deflected aberration is generated by passing the electron beams 2 off the axis of the aberration adjustment lens 14, thereby reducing the off-axis amount on the aberration generation lens 13 required for generating the same aberration amount as in the fifth exemplary embodiment. Thereby, the high-order aberration amount to be generated on the aberration generation lens 13 can be restricted, which facilitates each lens to be controlled.

Seventh Exemplary Embodiment

Figure 11:
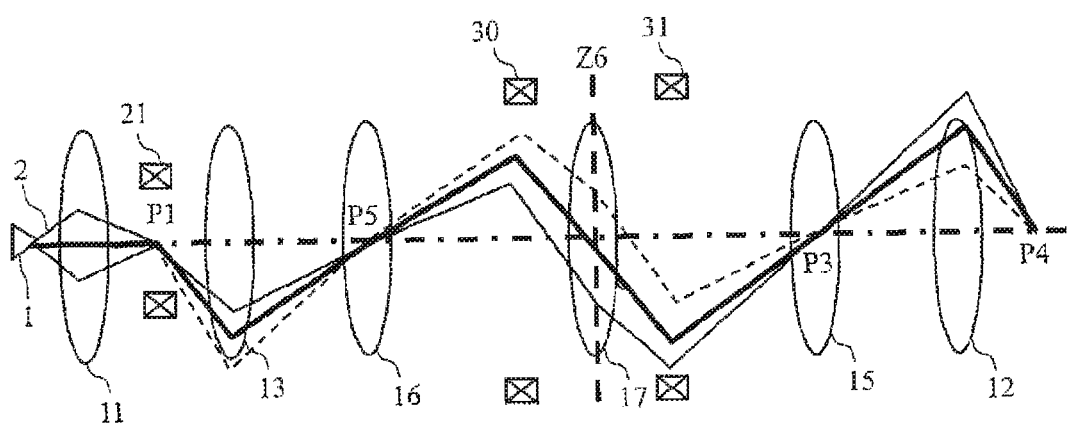
FIG. 11 is a diagram for explaining a structure of an optical system provided in a charged-particle-beam device according to a seventh exemplary embodiment.

FIG. 11 is a diagram for explaining a structure of an optical system provided in a charged-particle-beam device according to a seventh exemplary embodiment of the present invention. According to the seventh exemplary embodiment, a trajectory focus lens 17 focuses the electron beams 2 with different opening angles on the point P3 on the principal plane of the correction lens 15 according to the deflection operations of deflectors 30 and 31. A second correction lens 16 is configured to be equivalent to the correction lens 15. That is, there is configured, with respect to the second correction lens 16, such that the electron beams 2 with different energy are focused on the principal plane of the aberration generation lens 13. The principal plane of the second correction lens 16 is arranged to overlap on the image plane of the aberration generation lens 13. The electron beams 2 with different opening angles cross over on the point PS on the principal plane of the second correction lens 16 and on the point P3 on the principal plane of the correction lens 15.

With the arrangement of the lenses in FIG. 11, when an offset relative to the center trajectory on the principal plane of the aberration generation lens 13 and an offset relative to the center trajectory on the principal plane of the objective lens 12 are arranged to be symmetric about a principal plane Z6 of the trajectory focus lens 17. An axial offset of the center trajectory on the principal plane of the aberration generation lens 13 and an axial offset of the center trajectory on the principal plane of the objective lens 12 are arranged to be antisymmetric about the principal plane Z6 of the trajectory focus lens 17. Therefore, the entire optical system in FIG. 11 can produce the same effects as the optical system in FIG. 1.

Figure 12:
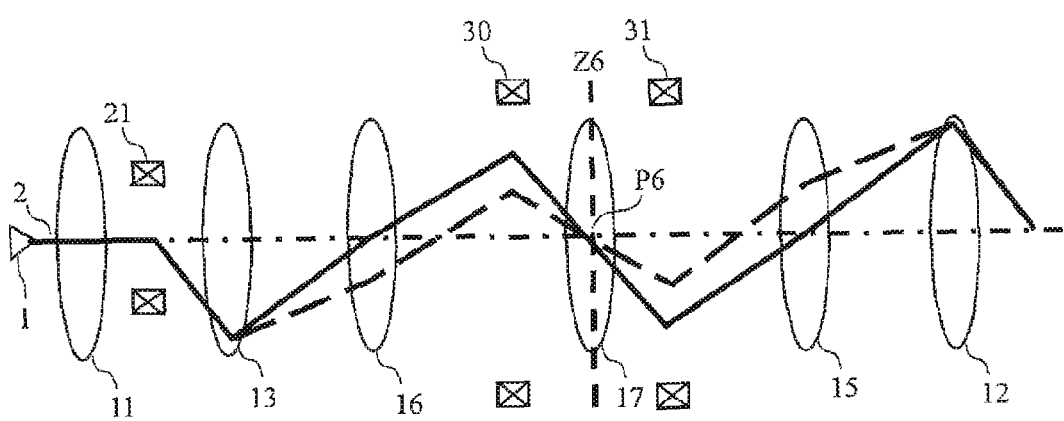
FIG. 12 is a diagram illustrating a plurality of trajectories of electron beams 2 with different energy.

FIG. 12 is a diagram illustrating a plurality of trajectories of the electron beams 2 with different energy. The principal plane of the trajectory focus lens 17 is arranged to overlap on a crossover position P6 where the electron beams 2 with different energy pass through the second correction lens 16 and then focus. Thereby, the trajectories of the electron beams 2 with different energy are antisymmetric about the principal plane Z6 of the trajectory focus lens 17, and thus the aberrations caused due to a difference in energy are equal in amount and different in sign before and after Z6 to cancel each other. Therefore, the entire optical system in FIG. 12 can produce the same effects as the optical system in FIG. 3.

Figure 13:
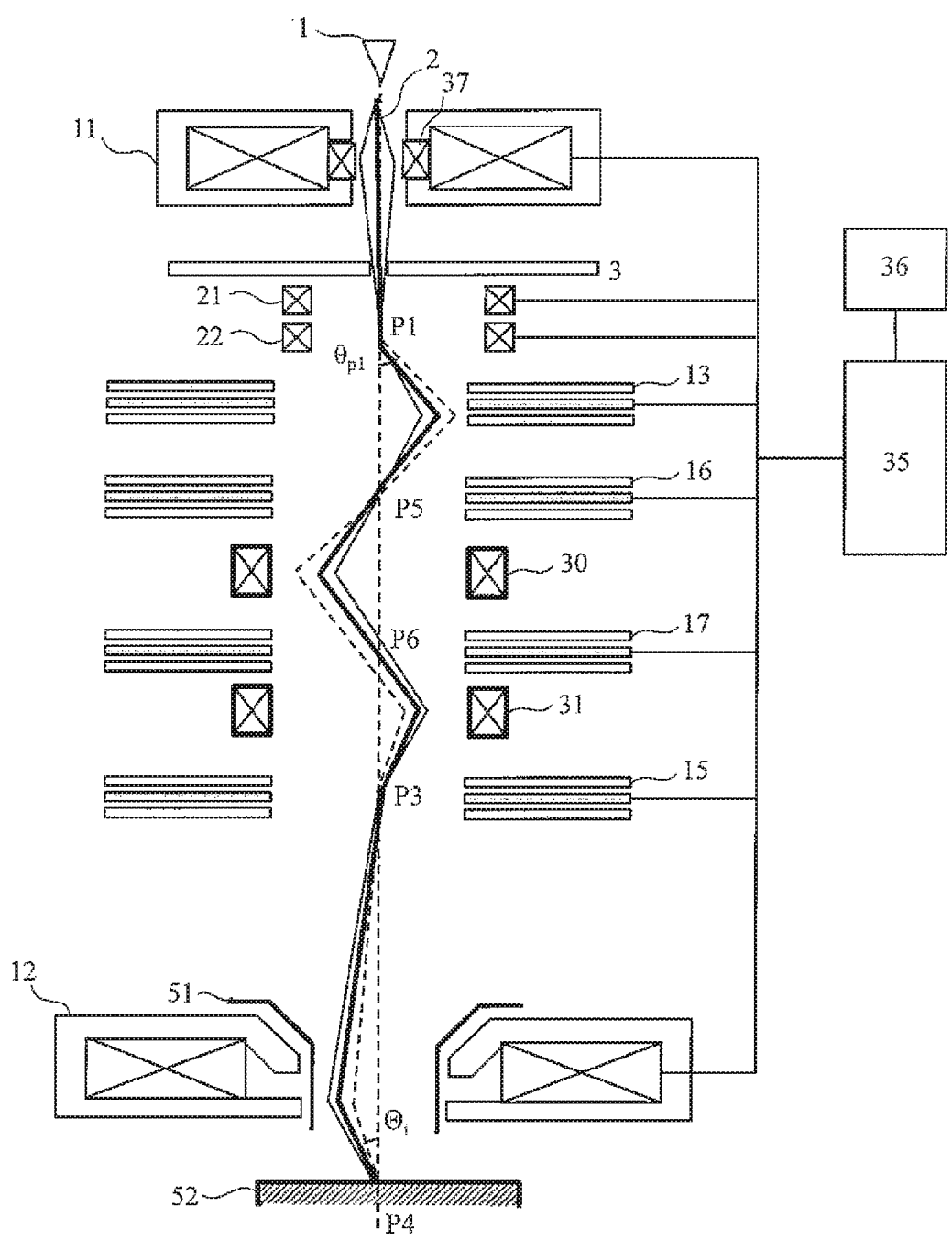
FIG. 13 is a side view illustrating a structure of the charged-particle-beam device according to the seventh exemplary embodiment.

FIG. 13 is a side view illustrating a structure of the charged-particle-beam device according to the seventh exemplary embodiment. The electron beams 2 discharged from the chip 1 are focused on the point P1 by the condenser lens 11, and pass off the axis of the aberration generation lens 13 by the deflector 21 (or the deflectors 21 and 22) to be focused on the point P5. The second correction lens 16 is arranged on the point P5, and gives the lens operation only to the electron beams 2 with different energy (FIG. 12). The deflector 30 deflects the electron beams 2 toward the center of the trajectory focus lens 17 (FIG. 11). The trajectories with different opening angles are focused on the point P3 by the lens operation of the trajectory focus lens 17 and the deflector 31. The subsequent operations are the same as in the first exemplary embodiment.

The present invention is not limited to the above exemplary embodiments, and encompasses various variants. The above exemplary embodiments have been described in detail for easy understanding of the present invention, and the present invention is not necessarily limited to ones including all the components. Part of the components of an exemplary embodiment may be replaced with the components of other exemplary embodiment, Further, the components of an exemplary embodiment may be added with the components of other exemplary embodiment. Further, part of the components of each exemplary embodiment may be added with other components, deleted, or replaced therewith.

Each lens (the condenser lens 11, the aberration generation lens 13, the aberration adjustment lens 14, the correction lens 15, and the objective lens 12) provided in the charged-particle-beam device according to the present invention may be of any type of electrostatic type, magnetic field type, and electromagnetic superimposed type. The lenses may be employed in combination.

There has been described by way of example according to the above exemplary embodiments a scanning electronic microscope in which the electron beams 2 are tilted by a deflector to scan the specimen 52, thereby acquiring a tilt image of the specimen 52. The same effects by the above operations can be expected also when the deflector performs image shifting for moving a field of observation. Thereby, image shifting over a lame area can be realized. Therefore, it is possible to acquire a high-resolution beams tilt image in a short time, and it is possible to realize SEM such as semiconductor device suitable for 3D observation of a specimen.

The charged-particle-beam device according to the present invention is not limited to devices using electron beams as charged-particle beams, and may be applied to general charged-particle-beam devices using other charged-particle beams such as ion microscope or ion processor (FIB).

REFERENCE SIGNS LIST

1: Electron source
2: Electron beam
3: Objective diaphragm
11: Condenser lens
12: Objective lens
13: Aberration generation lens
14: Aberration adjustment lens 15: Correction lens
16: Second correction lens
17: Trajectory focus lens
21 to 28 and 30 to 31: Deflector
35: Optical element control unit
36: Optical condition storage unit
37: Stigma coil
38: Stage height measurement device
51: Booster electrode
52: Specimen

The invention claimed is:

1. A charged-particle-beam device comprising:
a charged-particle-beam source for discharging charged-particle beams;
an objective lens for focusing the charged-particle beams on a specimen;
an aberration generation lens arranged between the objective lens and the charged-particle-beam source and directed for generating an aberration when the charged-particle beams pass off the axis; and
a correction lens for focusing trajectories of the charged-particle beams on a principal plane of the objective lens irrespective of energy of the charged-particle beams,
wherein the principal plane of the correction lens is arranged at a crossover position where the trajectories of the charged-particle beams with different opening angles pass through the aberration generation lens and then focus.

2. The charged-particle-beam device according to claim 1, wherein the principal plane of the correction lens is arranged to overlap on an object plane of the objective lens.

3. The charged-particle-beam device according to claim 1, wherein the aberration generation lens is configured to generate an aberration for cancelling an aberration generated on the objective lens.

4. The charged-particle-beam device according to claim 1, wherein the correction lens comprises a deflector arranged to overlap on the principal plane of the correction lens and directed for deflecting trajectories of the charged-particle beams.

5. The charged-particle-beam device according to claim 1, comprising:
a deflector for adjusting trajectories of the charged-particle beams such that the charged-particle beams pass through a center of the correction lens irrespective of a tilt angle of the charged-particle beams.

6. The charged-particle-beam device according to claim 1, comprising:
an aberration adjustment lens for adjusting an aberration generated by the aberration generation lens
wherein the aberration generation lens and the aberration adjustment lens are configured such that a combined aberration generated by combining an aberration generated by the aberration generation lens and an aberration generated by the aberration adjustment lens cancels an aberration generated by the objective lens.

7. The charged-particle-beam device according to claim 6, comprising:
an optical element control unit for controlling a spherical aberration coefficient of the objective lens, a chromatic aberration coefficient of the objective lens, an intensity of the aberration generation lens, and an intensity of the aberration adjustment lens,
wherein the optical element control unit controls the intensity of the aberration generation lens and the intensity of the aberration adjustment lens so that the aberration generation lens changes a position where the charged-particle beams focus, thereby adjusting the combined aberration to cancel an aberration generated by the objective lens depending on a change in the spherical aberration coefficient of the objective lens and the chromatic aberration coefficient of the objective lens.

8. The charged-particle-beam device according to claim 1, comprising:
a deflector for deflecting the charged-particle beams depending on a tilt angle of the charged-particle beams and passing the charged-particle beams through a center of the aberration adjustment lens.

9. The charged-particle-beam device according to claim 6, comprising:
a deflector for deflecting the charged-particle beams and passing the charged-particle beams off the axis of the aberration adjustment lens.

10. The charged-particle-beam device according to claim 1, comprising:
a deflector for tilting the charged-particle beams arranged in the field of the objective lens.

11. The charged-particle-beam device according to claim 1, comprising:
a trajectory focus lens arranged between the correction lens and the aberration generation lens and directed for generating an aberration when the charged-particle beams pass off the axis; and
a second correction lens for focusing the trajectories of the charged-particle beams on the principal plane of the trajectory focus lens irrespective of energy of the charged-particle beams,
wherein the principal plane of the trajectory focus lens is arranged at a crossover position where the charged-particle beams with different energy pass through the second correction lens and then focus.

12. The charged-particle-beam device according to claim 11,
wherein the trajectory focus lens comprises a deflector for deflecting the charged-particle beams with different opening angles on the principal plane of the correction lens, and a deflector for deflecting the charged-particle beams with different energy on the principal plane of the trajectory focus lens.

* * * * *